United States Patent [19]

Vyne et al.

[11] Patent Number: 4,721,921
[45] Date of Patent: Jan. 26, 1988

[54] AMPLIFIER HAVING IMPROVED GAIN/BANDWIDTH PRODUCT

[75] Inventors: Robert L. Vyne; William F. Davis, both of Tempe, Ariz.

[73] Assignee: Motorola, Inc., Schaumburg, Ill.

[21] Appl. No.: 944,048

[22] Filed: Dec. 22, 1986

[51] Int. Cl.$^4$ ............................................. H03F 3/45
[52] U.S. Cl. ................................. 330/260; 330/257
[58] Field of Search ............... 330/252, 257, 259, 260, 330/261

[56] References Cited

U.S. PATENT DOCUMENTS 4,555,670 11/1985 Tanaka ............................. 330/257

Primary Examiner—Gene Wan
Attorney, Agent, or Firm—Vincent B. Ingrassia

[57] ABSTRACT

In an operational amplifier having an input stage of the type wherein first and second differentially coupled transistors cooperate with a current mirror circuit, an output transistor is provided having a compensation capacitor coupled between its collector and the input stage. The gain bandwidth product is enhanced by coupling a positive feedback device (e.g. a capacitor) between a collector of the output transistor and the collector of the first input transistor.

6 Claims, 1 Drawing Figure

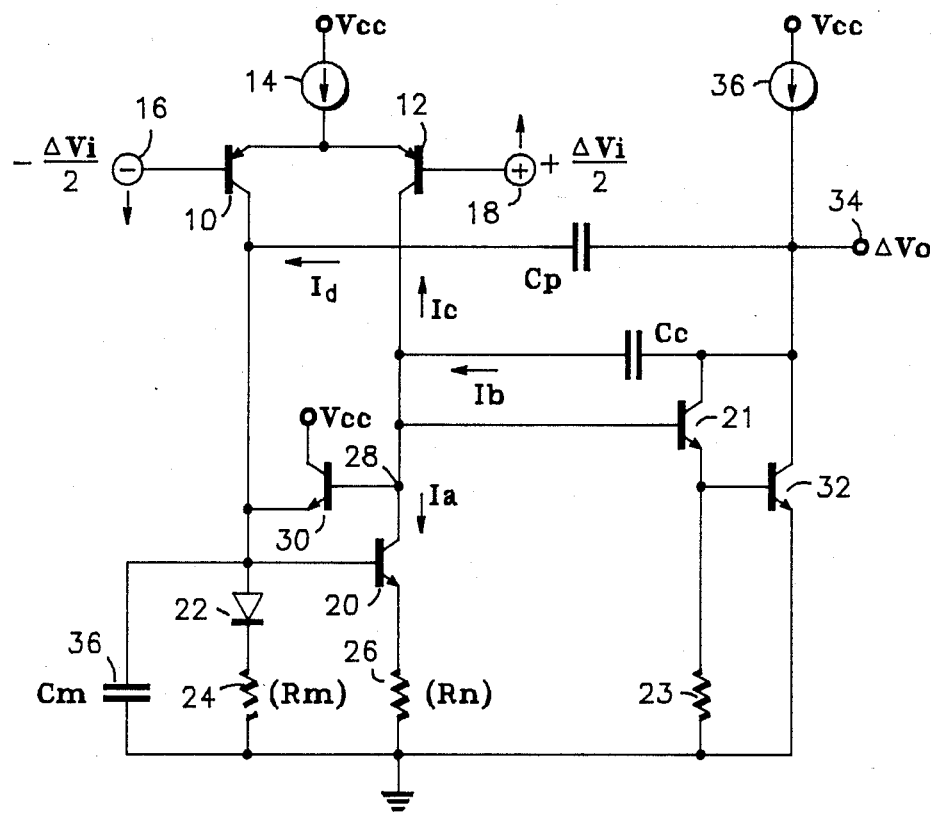

AMPLIFIER HAVING IMPROVED GAIN/BANDWIDTH PRODUCT

BACKGROUND OF THE INVENTION

This invention relates generally to amplifiers, and more particularly to an operational amplifier having an improved gain bandwidth product.

In the case of an operational amplifier utilizing single pole compensation, the open loop gain is generally larger at a low frequency and decreases to unity at the unity gain frequency ($f_u$) at a rate of 20 db per decade. The gain bandwidth product (GBW) for such a single pole slope is a product of frequency ($f_1$) and the gain ($A_1$) at $f_1$; i.e. $GBW = A_1 \cdot f_1 = f_u$. There may be applications, however, where for operation at $f_1$, a gain greater than $A_1$ is desired. Merely increasing $A_1$ would result in substantially increasing the unity gain frequency which in turn may cause the amplifier to be unstable in a closed loop unity gain configuration.

It is well known that the gain $A_1$ can be increased without increasing the unity gain frequency by adding a pole/zero transfer function to the forward signal path. Generally, the pole is at a lower frequency and the zero is at a higher frequency and both frequencies are less than the unity gain frequency. This combination permits a reduction in the unity gain frequency while at the same time cancelling the undesirable phase introduced by the added pole.

Copending U.S. patent application Ser. No. 880,475 filed June 30, 1986, entitled AMPLIFIER HAVING IMPROVED GAIN BANDWIDTH PRODUCT and assigned to the assignee of the present invention discloses a circuit wherein a pole/zero doublet is added into the transfer function such that the zero ($Z_1$) appears at a frequency twice that of the added pole ($P_1$) doubling the gain bandwidth product relative to the unity gain frequency. That is, GBW equals $2f_u$. It would be desirable, however, to produce a system wherein the added pole may be reduced in frequency by greater than a factor of two, for example in AC shorted current mirrors, thus bringing about a correspondingly greater improvement in gain bandwidth product.

SUMMARY OF THE INVENTION

It is an object of the present invention to provide an improved operational amplifier.

It is a further object of the present invention to provide an improved operational amplifier having enhanced gain bandwidth product.

It is a still further object of the present invention to provide an operational amplifier which is improved by adding a pole/zero doublet such that the added pole may be reduced in frequency with respect to the added zero by greater than a factor of two.

According to a broad aspect of the invention there is provided an amplifier circuit, comprising first and second differentially coupled input transistors each having base, emitter and collector terminals. The emitter terminals are coupled to a first source of supply voltage, and the base terminals of the first and second input transistors are coupled to receive first and second input signals respectively. Current mirror means are provided for coupling between the collector terminals of the first and second input transistors and a second source of supply voltage. An output transistor is provided having base, the and collector terminals, the emitter for coupling to the second source of supply voltage. The base is coupled to the collector of the second input transistor, and the collector is coupled to the first source of supply voltage. The collector of the output transistor forms the amplifier's output at which an output current is generated in response to the relative magnitudes of the first and second input signals. A compensation capacitor is coupled between the collector of the output transistor and the collector of the second input transistor, and positive feedback means is coupled between the collector of the output transistor and the collector of the first input transistor.

BRIEF DESCRIPTION OF THE DRAWING

The above and other object, features and advantages of the present invention will be more clearly understood from the following detailed description taken in conjunction with the accompanying drawing which is a schematic diagram of the inventive operational amplifier circuit.

DESCRIPTION OF THE PREFERRED EMBODIMENT

Referring to the drawing, the emitters of first and second differentially coupled PNP input transistors 10 and 12 are coupled via current source 14 to a source of supply voltage $V_{CC}$. The base electrodes of transistors 10 and 12 are coupled to input terminals 16 and 18 respectively. The collectors of transistors 10 and 12 are coupled across a current mirror circuit comprised of NPN transistor 20, diode 22 and resistors 24 and 26 each of which have a resistance $R_m$. The collector of transistor 10 is coupled to the base of transistor 20 and to the anode of diode 22. The collector of transistor 12 is coupled to the collector of transistor 20 and to node 28. Resistor 24 is coupled between the cathode of diode 22 and a second source of supply voltage (e.g. ground), and resistor 26 is coupled between the emitter of transistor 20 and ground. NPN transistor 21 has a base coupled to node 28, an emitter coupled to the base of NPN transistor 32 and, via resistor 23 to ground, and has a collector coupled to the collector of transistor 32. Transistor 30 has a collector coupled to $V_{CC}$, an emitter coupled to the anode of diode 22, and a base coupled to node 28. NPN transistor 32 has a collector coupled to output terminal 34 and, via current source 36, to $V_{CC}$, and has an emitter coupled to ground.

Finally, capacitor $C_m$ is coupled between ground and the anode of diode 22, compensation capacitor $C_c$ is coupled between node 28 and the collector of transistor 32, and capacitor $C_p$ is coupled between the collector of transistor 32 and the collector of transistor 10. If desired, capacitor $C_m$ could be coupled only across resistor 24.

Ignoring capacitors $C_m$ and $C_p$ for the moment, the circuit functions in the well known manner. If, for example, the voltage at input terminal 16 were less than that at input terminal 18, transistor 10 would turn on harder than transistor 12. The current mirror circuit would attempt to mirror the current flowing in the collector of transistor 10 at the collector of transistor 20. Since this current would be greater than the current flowing in the collector of transistor 12, the voltage at node 28 would fall. Transistor 32 would be maintained in an off condition, and the voltage at output terminal 34 would remain high.

On the other hand, should the voltage at terminal 18 fall below that at terminal 16, transistor 12 would conduct more current than transistor 10. The mirror circuit would mirror the lesser current flowing in the collector of transistor 10 at the collector of transistor 20. Thus, since transistor 12 is sourcing more current into node 28 than is being diverted by transistor 20, the voltage at output node 28 would rise causing transistor 32 to turn on. This results in a decrease of the voltage at output node 34.

It should be apparent that at high frequencies, capacitor 36 shorts out the mirror circuit, thereby effectively removing resistor 24 from consideration. Without resistor 24, the signal voltage at the base of transistor 20 is considerably less since it is the product of the signal flowing in the collector of transistor 10 times the dynamic resistance of diode 22. Since the transconductance of transistor 20 has not changed, the signal current flowing through transistor 20 is substantially reduced which has a significant effect on the change in signal current at output node 28.

Using well known circuit analysis techniques, it can be shown that the mirror pole $\omega_p$ may be represented by $$\omega_p \approx 1/(C_p + C_m) R_m \qquad (1)$$

Assuming $R_m$ is much greater than $r_e$ of the mirror where $r_e$ is a dynamic resistance of diode 22, the currents flowing into and out of node 28 may be represented as $$I_a + I_c = I_b \qquad (2)$$

Again, using well know techniques, it may be shown that $$I_a = [\omega_p/(s+\omega_p)](g_m \Delta V_i/2 + SC_p \Delta V_o) \qquad (3)$$

where $$I_b = SC_c \Delta V_o \qquad (4)$$

$$I g_m \delta V_i/2 \qquad (5)$$

where $\Delta V_i$ represents a changing input voltage at terminals 16 and 18 which results in a change in output voltage $\Delta V_O$ at terminal 34 and $g_m$ is the transconductance of transistors 10 and 12.

By substituting equations (3), (4) and (5) into equation (2) and rearranging there is obtained $$\Delta V_o/\Delta V_i = [\omega_p g_m + g_m(s+\omega_p)]/2[SC_c(S+\omega_p) - S\omega_p C_p] \qquad (6)$$

Thus, there are two poles at $$\omega_D = 0 \qquad (7)$$

$$\omega_p' = -\omega_p + \omega_p C_p/C_c \qquad (8)$$
$$= -\omega_p(C_c - C_p)/C_c$$
$$= -\omega_p \Delta C/C$$

where $\Delta C = C_c - C_p$ and assuming that the DC resistance at node 28 is infinite. Thus, the location of the new mirror pole $\omega_p'$ is represented as follows $$f_p' = f_p \Delta c/C_c \qquad (9)$$

The zero derived from equation (6) is represented by $$f_z \approx 2f_p \qquad (10)$$

Thus, through the addition of capacitor $C_p$, the mirror pole has been moved to a lower frequency and may be positioned independently of the mirror zero at any frequency below the mirror zero frequency, and the dominant pole is moved out in frequency by $C_c/\Delta C$. It should therefore be clear that the gain of the system can be significantly increased without increasing the unity gain frequency. The positive slew rate response is also improves by using the positive AC feedback capacitor $C_p$ to the current mirror.

Finally, transistor 30 coupled as shown in FIG. 1 eliminates substrate injection of electrons during negative output slew. That is, the voltage at node 28 is used as a reference for the base of transistor 30, and the emitter of transistor 30 is maintained at one $V_{be}$ below the voltage at node 28.

The above description is given by way of example only. Changes in form and details may be made by one skilled in the art without departing from the scope of the invention as defined by the appended claims.

We claim:
1. An amplifier circuit, comprising:
   first and second differentially coupled input transistors each having base, emitter and collector terminals, said emitter terminals for coupling to a first source of supply voltage, and the base terminals of said first and second input transistors being coupled to receive first and second input signals respectively;
   current mirror means for coupling between the collector terminals of said first and second input transistors and a second source of supply voltage;
   an output transistor having base, emitter and collector terminals, said emitter for coupling to said second source of supply voltage, said base coupled to the collector of said second input transistor, and said collector for coupling to said first source of supply voltage, said collector of said output transistor forming the amplifier's output at which an output current is generated in response to relative magnitudes of said first and second input signals;
   a compensation capacitor coupled between the collector of said output transistor and the collector of said second input transistor; and
   positive feedback means coupled between the collector of said output transistor and the collector of said first input transistor.

2. An amplifier circuit according to claim 1 wherein said positive feedback means comprises a second capacitor coupled between the collector of said output transistor and the collector of said first input transistor.

3. An amplifier circuit according to claim 2 further comprising voltage clamping means coupled between the collectors of said first and second input transistors.

4. An amplifier circuit according to claim 3 wherein said voltage clamping means comprises a third transistor having a collector for coupling to said first source of supply voltage, a base coupled to the collector of said second input transistor, and an emitter coupled to the collector of said first input transistor.

5. An amplifier circuit according to claim 4 wherein said current mirror means comprises:
   first diode means having an anode coupled to the collector of said first input transistor and a cathode for coupling to said second source of supply voltage; and a third transistor having a collector coupled to the collector of said second input transistor, a base coupled to the anode of said first diode means, and an emitter for coupling to said second source of supply voltage.

6. An amplifier circuit according to claim 5 wherein said current mirror means further comprises:
a first resistor coupled between the cathode of said first diode means and said second source of supply voltage; and
a second resistor coupled between the emitter of said third transistor and said second source of supply voltage.

* * * * *